United States Patent
Lee et al.

(10) Patent No.: US 9,929,344 B1
(45) Date of Patent: Mar. 27, 2018

(54) METHOD OF FORMING AN ORGANIC LIGHT-EMITTING DIODE DISPLAY DEVICE HAVING AN EXTENSION LINE CROSSING SECOND SIGNAL LINES

(71) Applicant: LG DISPLAY CO., LTD., Seoul (KR)

(72) Inventors: Jeonghwa Lee, Incheon (KR); Minjae Shin, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/824,084

(22) Filed: Nov. 28, 2017

Related U.S. Application Data

(62) Division of application No. 15/210,386, filed on Jul. 14, 2016, now Pat. No. 9,859,496.

(30) Foreign Application Priority Data

Dec. 29, 2015 (KR) .................. 10-2015-0189011

(51) Int. Cl.
  *H01L 51/50* (2006.01)
  *H01L 51/00* (2006.01)
  *H01L 51/56* (2006.01)
  *H01L 27/32* (2006.01)

(52) U.S. Cl.
  CPC ...... *H01L 51/0031* (2013.01); *H01L 27/3276* (2013.01); *H01L 51/56* (2013.01); *H01L 2227/323* (2013.01); *H01L 2251/5392* (2013.01)

(58) Field of Classification Search
  CPC . H01L 27/3276; H01L 51/50; H01L 51/0031; H01L 2251/5392
  See application file for complete search history.

(56) References Cited

U.S. PATENT DOCUMENTS 8,981,378 B2 * 3/2015 Kim .................. H01L 27/124
  257/32
2017/0177125 A1 6/2017 Kim

* cited by examiner

*Primary Examiner* — Hoai V Pham
(74) *Attorney, Agent, or Firm* — Dentons US LLP

(57) ABSTRACT

Disclosed is a display device having a display panel that includes a plurality of pixels in a display area, each pixel including a first thin film transistor (TFT); a plurality of pads in a non-display area outside the display area that provide operating signals to the plurality of pixels in the display area, each pad including a first signal line running toward the display area and a second signal line running toward an outer edge of the display panel, with each pad disposed between the first and second signal lines; and an extension line crossing one or more of second signal lines of the plurality of pads, two ends of the extension line running toward the outer edge of the display panel, wherein each of the one or more of second signal lines of the plurality of pads includes an active layer of a second TFT.

10 Claims, 10 Drawing Sheets

METHOD OF FORMING AN ORGANIC LIGHT-EMITTING DIODE DISPLAY DEVICE HAVING AN EXTENSION LINE CROSSING SECOND SIGNAL LINES

This application is a Divisional of application Ser. No. 15/210,386, filed Jul. 14, 2016, which claims priority from and the benefit of Korean Patent Application Number 10-2015-0189011 filed on Dec. 29, 2015, which is incorporated herein by reference for all purposes as if fully set forth herein.

BACKGROUND

Field of the Invention

The present disclosure relates to a display device and method of manufacturing the same. More particularly, the present disclosure relates to an organic light-emitting diode (OLED) display device and method of manufacturing the same.

Discussion of the Related Art

In response to the development of the information society, there has been increasing demand for various types of display devices that are able to display images. A range of display devices, such as liquid crystal display (LCD) devices, plasma display panels (PDPs), and organic light-emitting diode (OLED) display devices, are in common use.

Among these display devices, OLED display devices have reduced weight and thickness. Since OLED display devices are self-emitting, no backlight, which is commonly used in LCD devices, is typically required. In addition, OLED display devices have many advantages over LCD devices, such as wide viewing angle, high contrast ratio, and lower power consumption. OLED display devices have other advantages, such as the ability to operate at a low direct current (DC) voltage, high response speed, high resistance to external impacts due to solid inner components, and in particular, low fabrication costs.

In general, a plurality of OLED display panels are formed on a single raw substrate, which is then scribed into respective panels. Afterwards, each respective panel is subjected to a signal test to detect a defect in signal lines, such as a short circuit or a disconnection, or a defect in thin-film transistors (TFTs).

To do so, a plurality of signal lines disposed in a pad area are connected to shorting bars formed from a conductive material. Signals are applied to a plurality of signal lines through the shorting bars to inspect whether or not TFTs in the entirety of the pixels of the panel operate properly. After the signal inspection on the TFT array is completed, the raw substrate is cut along scribing lines.

Here, impurities or moisture generated during the cutting process of removing the shorting bars in the pad areas may cause a short circuit or a leakage current between the signal lines.

SUMMARY

Accordingly, the present invention is directed to a display device and a method of manufacturing the same that substantially obviate one or more problems due to limitations and disadvantages of the related art.

An advantage of the present invention is to provide a display device with improved reliability.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a display device having a display panel, the display panel may, for example, include a plurality of pixels in a display area, each pixel including a first thin film transistor (TFT); a plurality of pads in a non-display area outside the display area that provide operating signals to the plurality of pixels in the display area, each pad including a first signal line running toward the display area and a second signal line running toward an outer edge of the display panel, with each pad disposed between the first and second signal lines; and an extension line crossing one or more of second signal lines of the plurality of pads, two ends of the extension line running toward the outer edge of the display panel, wherein each of the one or more of second signal lines of the plurality of pads includes an active layer of a second TFT.

In another aspect of the present invention, a method of manufacturing an organic light-emitting diode (OLED) display device may, for example, include forming a display area of a display panel including an array of pixels on a substrate, each pixel including a first thin film transistor (TFT); forming a plurality of pads in a non-display area of the display panel outside the display area, each pad connected to a first signal line extended to the array of pixels in the display area; forming a plurality of shorting bars outside the plurality of pads, each pad connected to a second signal line that is electrically connected to one the plurality of shorting bars; forming an extension line crossing one or more of second signal lines of the plurality of pads, the extension line having two ends that are electrically connected to one or more of the plurality of shorting bars; inspecting an operation of the array of pixels by applying test signals to the plurality of shorting bars; and removing the shorting bars from the display panel.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Figure 1:
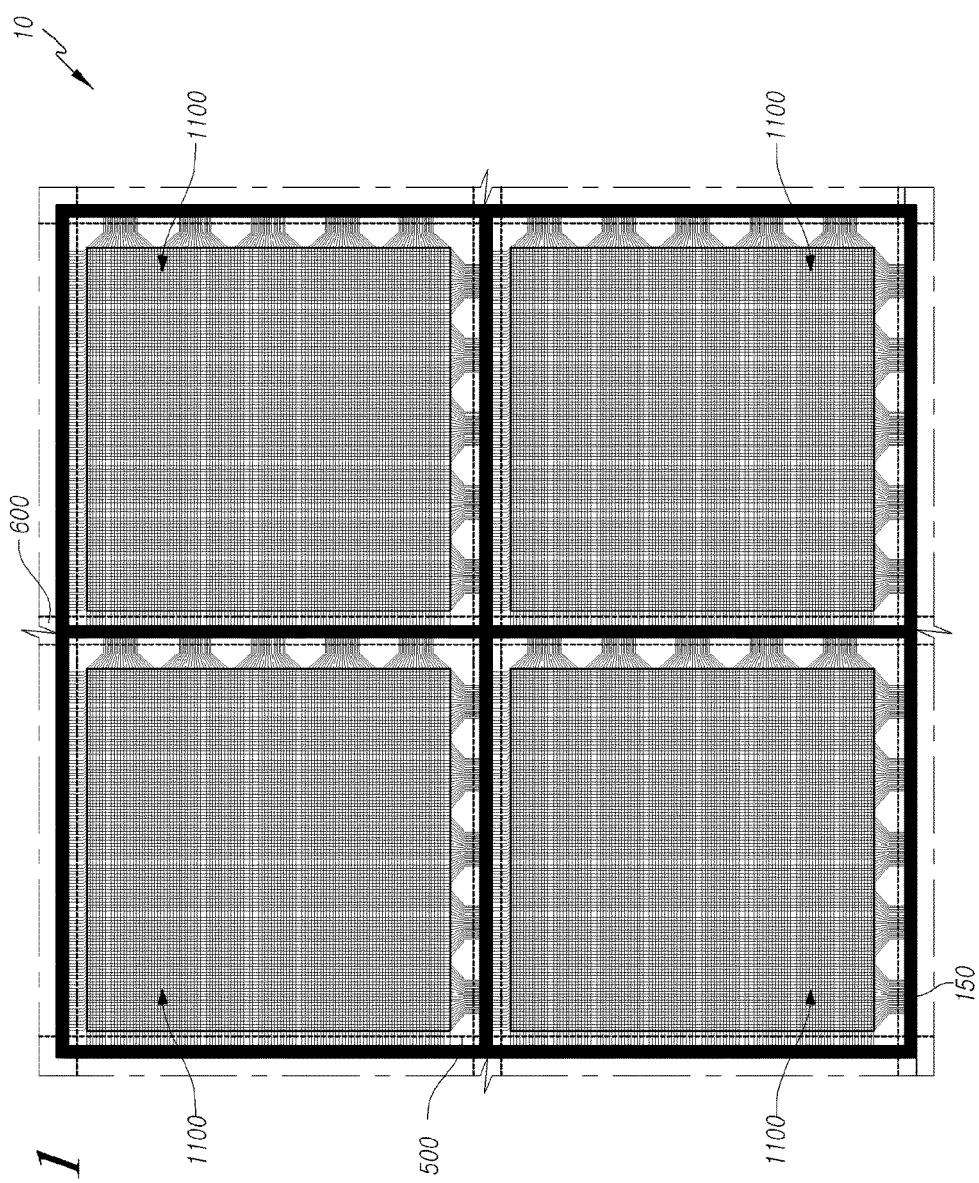
FIG. 1 is a plan view illustrating a raw substrate for a display device to which embodiments are applied.

Reference will now be made in detail to embodiments of the present disclosure, examples of which are illustrated in the accompanying drawings. The embodiments set forth herein are provided for illustrative purposes to fully convey the concept of the present disclosure to a person skilled in the art. The present disclosure should not be construed to be limited to these embodiments and may be embodied in many different forms. In the drawings, the size and thickness of the device may be exaggerated for the sake of clarity. Throughout this document, the same reference numerals and signs will be used to designate the same or like components.

The advantages and features of the present disclosure and methods of the realization thereof will be apparent with reference from the accompanying drawings and detailed descriptions of the embodiments. The present disclosure should not be construed to be limited to the embodiments set forth herein and may be embodied in many different forms. Rather, these embodiments are provided so that the present disclosure will be thorough and complete, and will fully convey the scope of the present disclosure to a person skilled in the art. The scope of the present disclosure shall be defined by the appended Claims. Throughout this document, the same reference numerals and signs will be used to designate the same or like components. In the drawings, the sizes and relative sizes of layers and areas may be exaggerated for the sake of clarity.

It will be understood that when an element or a layer is referred to as being "on" another element or layer, not only can it be "directly on" the other element or layer, but it can also be "indirectly on" the other element or layer via an "intervening" element or layer. In contrast, when an element or a layer is referred to as being "directly on" another element or layer, it will be understood that no intervening element or layer is interposed.

Spatially relative terms such as "below," "beneath," "lower," "above," and "upper" may be used herein for the ease of description of the relationship of an element or components to another element or other components as illustrated in the drawings. The spatially relative terms should be construed as terms encompassing different orientations of the element in use or operation in addition to the orientation depicted in the drawings. For example, when elements illustrated in the drawings are turned over, an element described as "below" or "beneath" another element would then be oriented "above" the other element. Thus, the example term "below" or "beneath" can encompass both orientations of above and below.

In addition, terms such as "first," "second," "A," "B," "(a)," and "(b)" may be used herein to describe the components. It should be understood, however, that these terms are only used to distinguish one component from another component and the substance, order, sequence, or number of the components is not limited by these terms.

FIG. 1 is a plan view illustrating a raw substrate for a display device to which embodiments are applied.

Referring to FIG. 1, a raw substrate 10 for a display device according to an embodiment includes a plurality of display panels 1100 arranged in the form of matrix and shorting bars 150 electrically connecting a plurality of electrical lines through which inspection signals are supplied to the plurality of display panels 1100.

Specifically, the raw substrate 10 has areas for the display panels 1100 defined thereon, the areas for the display panels 1100 being spaced apart from each other. Spaces 600 are formed on the raw substrate 10, each of the spaces 600 being interposed between the adjacent display panels 1100.

After an array of thin-film transistors (TFTs) is formed on the display panels 1100, signal tests are performed to detect defects in lines, such as a line short or a disconnection, and defects in TFTs. For this, the shorting bars 150 electrically connecting the plurality of electrical lines are disposed in pad areas of the display panels 1100.

Signal tests are performed to determine whether or not the TFTs of entire pixels operate properly by applying a driving current to a plurality of data lines through the shorting bars 150 and applying a reference voltage to reference voltage lines. After the signal tests on the TFT arrays are completed, the raw substrate 10 is cut along scribing lines 500 and an edge grinding is performed. In this way, the plurality of display panels 1100 are produced from the raw substrate 10.

Figure 2:
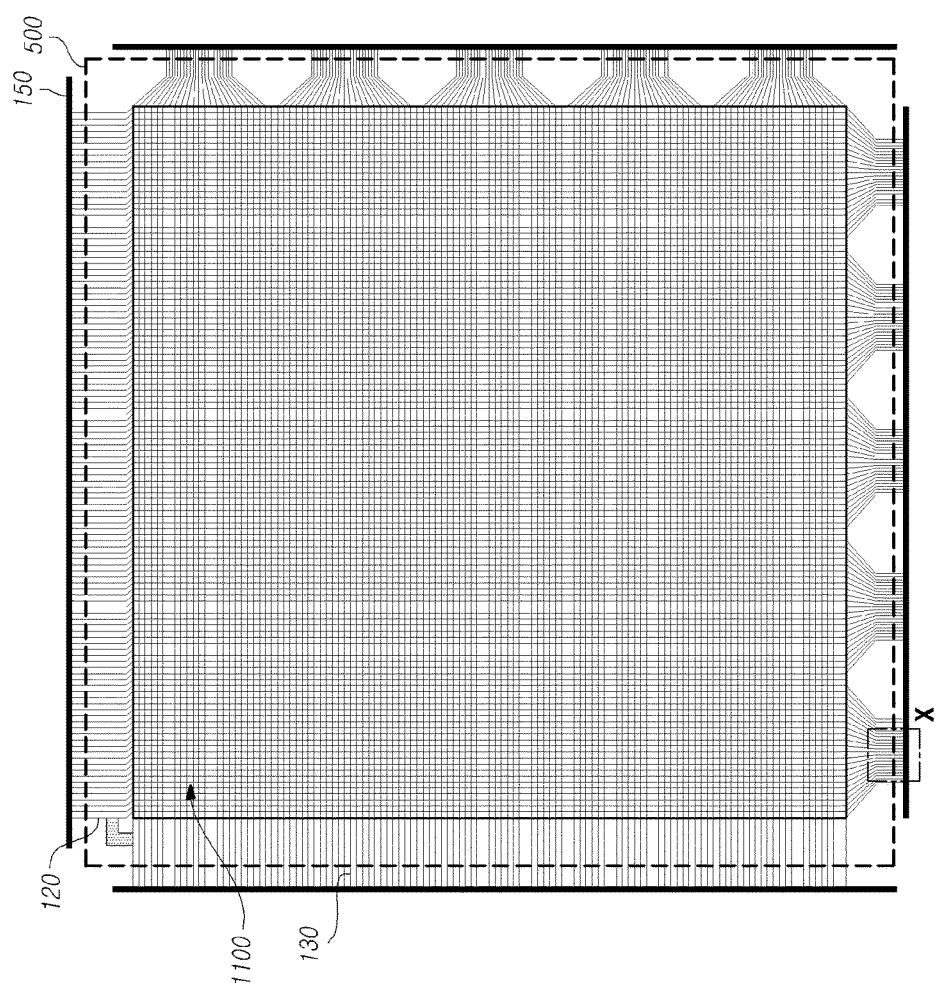
FIG. 2 is a plan view illustrating a single display panel and shorting bars enclosing the display panel.

Hereinafter, a single display panel 1100 and shorting bars 150 enclosing the display panel 1100 will be disclosed in detail with reference to FIG. 2. FIG. 2 is a plan view illustrating the single display panel 1100 and the shorting bars 150 enclosing the display panel 1100.

Referring to FIG. 2, the shorting bars 150 are disposed on outer peripheries of the single display panel 1100. The shorting bars 150 are disposed to substantially enclose the single display panel 1100. Here, a plurality of data lines 120, a plurality of reference voltage lines (not shown), and a plurality of gate lines 130 are connected to the shorting bars 150. The shorting bars 150 connected to the plurality of data lines 120 and the plurality of reference voltage lines (not shown) may be disposed separately from the shorting bars 150 connected to the plurality of gate lines 130, which makes it easy to independently inspect signal lines using the shorting bars 150. Although FIG. 2 illustrates a configuration in which the shorting bars 150 connected to the plurality of data lines 120 and the plurality of reference voltage lines (not shown) are separated from the shorting bars 150 connected to the plurality of gate lines 130, the display device according to the present embodiments is not limited thereto.

Specifically, the plurality of data lines 120 are arranged parallel to the plurality of reference voltage lines (not shown). The plurality of data lines 120 and the reference voltage lines (not shown) are connected to the shorting bars 150 disposed above and below the display panel 1100 in the plan view. In addition, the plurality of gate lines 130 are arranged to cross the plurality of data lines 120 and the plurality of reference voltage lines (not shown). The plurality of gate lines 130 are connected to the shorting bars 150 disposed on the right side and the left side of the display panel 1100 in the plan view.

Since an electrical insulation is provided between the four shorting bars 150 substantially enclosing the single display panel 1100, it is possible to inspect whether or not the panel is defective by measuring, for example, the resistance between the shorting bars 150. After the panel is inspected, the panel is cut along the scribing lines 500 in the areas between the shorting bars 150 and the display panel 1100, thereby removing the shorting bars 150.

Figure 3:
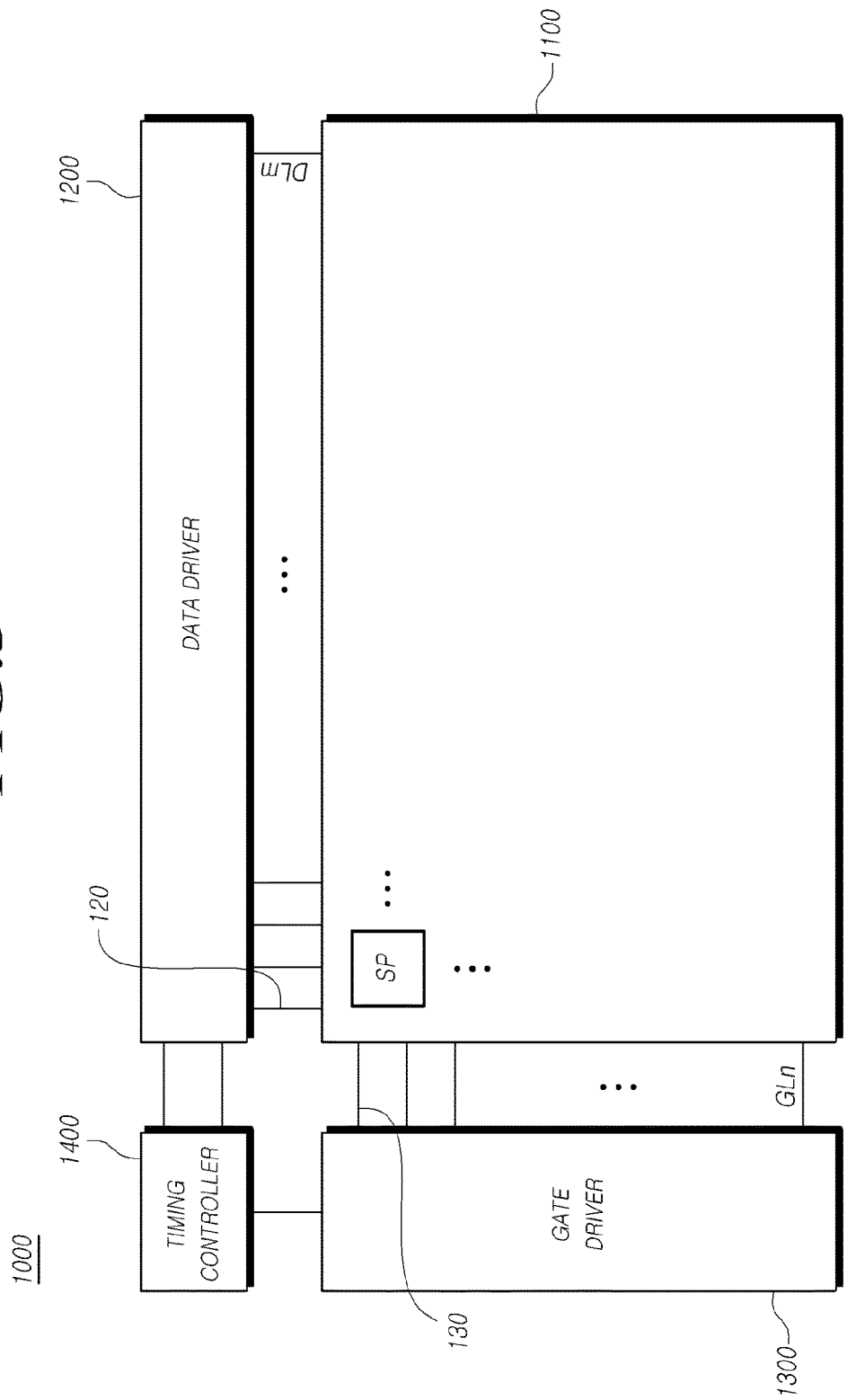
FIG. 3 is a schematic configuration view illustrating a display device according to embodiments.

The display device including the display panel 1100 to which the present embodiments are applied may be configured as illustrated in FIG. 3. FIG. 3 is a schematic configuration view illustrating a display device according to an embodiment.

Referring to FIG. 3, a display device 1000 includes: a display panel 1100 on which a plurality of data lines 120 and a plurality of gate lines 130 are disposed and a plurality of subpixels (SP) are defined; a data driver 1200 for driving the plurality of data lines 120; a gate driver 1300 for driving the plurality of gate lines 130; and a timing controller 1400 for controlling the data driver 1200 and the gate driver 1300.

The plurality of data lines 120 and the plurality of gate lines 130 illustrated in FIG. 3 may extend from the plurality of data lines 120 and the plurality of gate lines 130 connected to the shorting bars 150, as illustrated in FIG. 2.

The data driver 1200 drives the plurality of data lines 120 by supplying data voltages to the plurality of data lines 120. The gate driver 1300 sequentially drives the plurality of gate lines 130 by sequentially supplying scanning signals to the plurality of gate lines 130.

In addition, the timing controller 1400 controls the data driver 1200 and the gate driver 1300 by supplying control signals to the data driver 1200 and the gate driver 1300. The timing controller 1400 starts scanning based on timing realized by frames, converts video data input from an external source into a data signal format readable by the data driver 1200, outputs the converted video data, and in response to the scanning, regulates data processing at a suitable point in time.

The gate driver 1300 sequentially drives the plurality of gate lines 130 by sequentially supplying scanning signals respectively having an on or off voltage to the plurality of gate lines 130, under the control of the timing controller 1400. The gate driver 1300 is positioned on one side of the display panel 1100, as illustrated in FIG. 1. The gate driver 1300 may be positioned on both sides of the display panel 1100 depending on the driving system or the design of the display panel 1100.

In addition, the gate driver 1300 may include one or more gate driver integrated circuits (ICs). Each of the gate driver ICs may be connected to the bonding pads of the display panel 1100 by tape-automated bonding (TAB) or chip-on-glass (COG) bonding, may be implemented as a gate-in-panel (GIP)-type IC directly disposed on the display panel 1100, or in some cases, may be integrated with the display panel 1100, forming a portion of the display panel 1100.

Alternatively, each of the gate driver ICs may be implemented as a chip-on-film (COF) type driver IC. In this case, a gate driver chip corresponding to each gate driver IC may be disposed on a flexible film, with one end of the flexible film being bonded to the display panel 1100.

When a specific gate line 130 is opened, the data driver 1200 drives the plurality of data lines 120 by converting video data received from the timing controller 1400 into analog data voltages and supplying the analog data voltages to the plurality of data lines 120. In addition, the data driver 1200 may include one or more source driver integrated circuits (ICs) to drive the plurality of data lines 120.

Each of the source driver ICs may be connected to the bonding pads of the display panel 1100 by tape-automated bonding (TAB) or chip-on-glass (COG) bonding, may be directly disposed on the display panel 1100, or in some cases, may be integrated with the display panel 1100, forming a portion of the display panel 1100.

Alternatively, each of the plurality of source driver ICs may be implemented as a chip-on-film (COF) type driver IC. In this case, a source driving chip corresponding to each source driver IC is disposed on a flexible film. One end of the flexible film is bonded to at least one source printed circuit board (S-PCB), and the other end of the flexible film is bonded to the display panel 1100.

The S-PCB is connected to a control printed circuit board (C-PCB) via a connecting medium, such as a flexible flat cable (FFC) or flexible printed circuit (FPC). The timing controller 1400 is disposed on the C-PCB.

In addition, a power controller (not shown) may further be disposed on the C-PCB to supply voltages or currents to the display panel 1100, data driver 1200, the gate driver 1300, and the like, or to control voltages or currents to be supplied to the display panel 1100, data driver 1200, the gate driver 1300, and the like. The S-PCB and the C-PCB may be formed as a single PCB.

Subpixels SP may be defined on specific locations of the display area of the display panel 1100 where the data lines 120 cross the gate lines 130. Here, two to four subpixels SP may constitute a single pixel. In addition, each subpixel SP may selectively define a color, such as red (R), green (G), blue (B), and white (W), but the present embodiments are not limited thereto. For brevity, the display device according to the present embodiments will be described with reference to a configuration in which a single pixel includes four subpixels SP, a red (R) subpixel, a white (W) subpixel, a green (G) subpixel, and a blue (B) subpixel.

Figure 4:
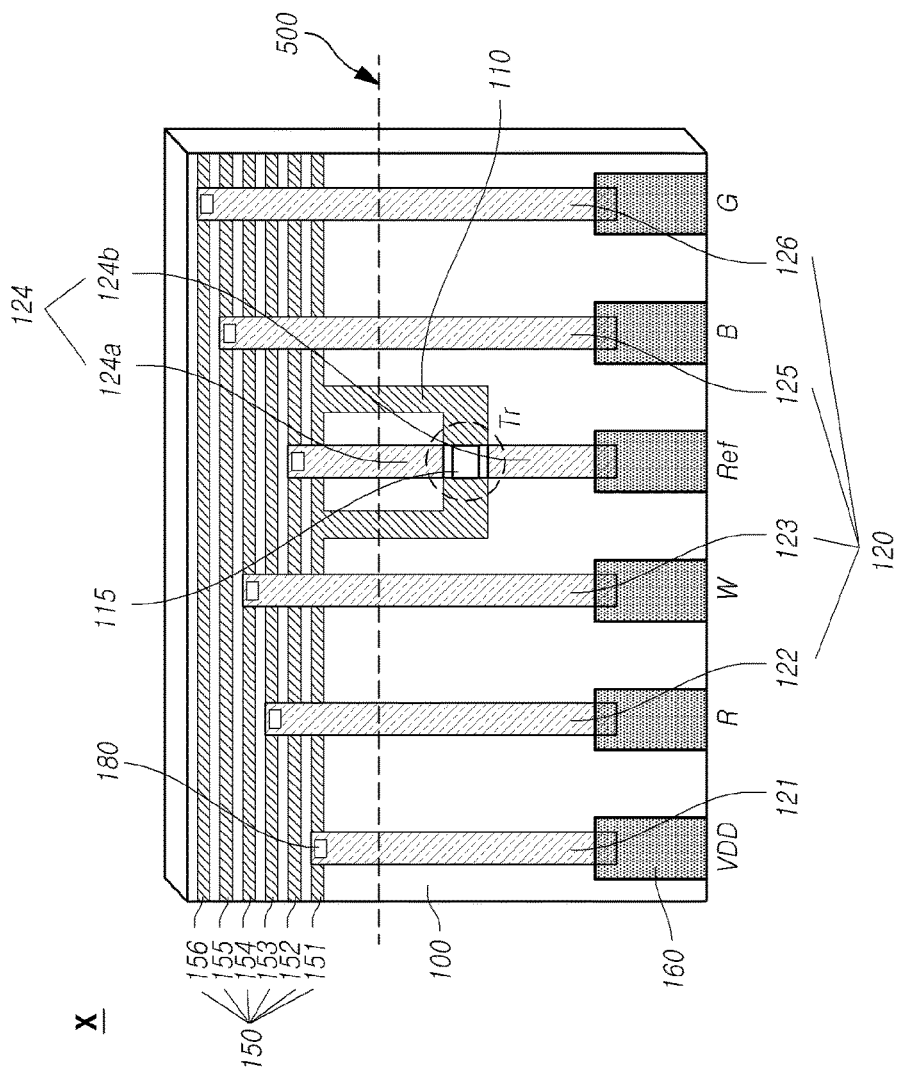
FIG. 4 is an expanded view of the area X in FIG. 2.

FIG. 4 is an expanded view of the area X in FIG. 2. Referring to FIG. 4, the area X represents a part of the pad area of the display panel according to the first embodiment, in which a plurality of shorting bars 150 are connected to a plurality of lines 120, 121, and 124. The pad area of the display panel according to the first embodiment may include at least one short prevention structure or device.

The pad area of the display panel according to the first embodiment indicates an area where pads for transferring signals to a portion of a non-display area or bezel area, which is typically a circumference of an image display area, also referred to as an active area, are located. In the pad area, the plurality of shorting bars 150 as well as the plurality of data lines 120, the power supply line 121, and the reference voltage line 124 connected to and the plurality of shorting bars 150 are disposed. A plurality of pads 160 for transferring voltages supplied from an external source and/or signals to the interior of the display panel are disposed in the pad area. The plurality of data lines 120, the power supply line 121, and the reference voltage line 124 extend to the display area of the display panel via the pads 160.

Although FIG. 4 illustrates the configuration of the single reference voltage line 124, only a part of the pad area is illustrated in FIG. 4. The display panel according to the first embodiment may include a plurality of reference voltage lines 124.

The plurality of shorting bars 150 include a first shorting bar 151, a second shorting bar 152, a third shorting bar 153, a fourth shorting bar 154, a fifth shorting bar 155, and a sixth shorting bar 156. Here, the first shorting bar 151 is connected to the power supply line 121, and the second shorting bar 152 is connected to the reference voltage line 124. The third shorting bar 153 is connected to the red (R) data line 122, the fourth shorting bar 154 is connected to the white (W) data line 123, the fifth shorting bar 155 is connected to the blue (B) data line 125, and the sixth shorting bar 156 is connected to the green (G) data line 126.

Although not illustrated in FIG. 4, the red (R) data line 122, the white (W) data line 123, the blue (B) data line 125, and the green (G) data line 126 may extend from the pad area to the display area. Thus, the red (R) data line 122, the white (W) data line 123, the blue (B) data line 125, and the green (G) data line 126 can supply driving voltages to the red (R) subpixel, the white (W) subpixel, the blue (B) subpixel, and the green (G) subpixel.

In addition, it is possible to perform a signal inspection on the TFT array using the plurality of shorting bars 150 connected to the plurality of data lines 120, the power supply line 121, and the reference voltage line 124. Here, the plurality of shorting bars 150 can supply driving currents or voltages to the plurality of data lines 120, the power supply line 121, and the reference voltage line 124. The plurality of shorting bars 150 may be connected to the plurality of data lines 120, the power supply line 121, and the reference voltage line 124 via contact holes 180.

That is, it is possible to inspect whether or not the TFTs of the entire pixels operate properly by applying driving currents or voltages to the red (R), white (W), green (G), and blue (B) data lines 122, 123, 125, and 126 and applying a reference voltage Vref to the reference voltage line 124 (e.g., on/off inspection).

Although not illustrated in the drawings, sensing signal lines (not shown) through which sensing signals for external compensation are supplied may be further disposed in the display area and the pad area. In addition, gate lines (not shown) through which gate driving signals (scanning signals) are supplied to the red (R), white (W), green (G), and blue (B) subpixels may be further disposed in the display area and the pad area.

An extension line 110 is further disposed in the pad area such that the extension line 110 overlaps the reference voltage line 124. Here, the extension line 110 may be branched from one shorting bar among the plurality of shorting bars 150. For example, the extension line 110 is branched from the first shorting bar 151 to overlap the reference voltage line 124. Although the configuration of the extension line 110 being branched from the first shorting bar 151 is illustrated in FIG. 4, the display device according to the first embodiment is not limited thereto.

The plurality of shorting bars 150 and the extension line 110 may be disposed on the same layer and may be formed from the same material. For example, the plurality of shorting bars 150 and the extension line 110 may be disposed on the same layer as the gate lines (not shown). In addition, the plurality of shorting bars 150 and the extension line 110 may be formed by stacking one or more selected from the group including copper (Cu), molybdenum (Mo), aluminum (Al), silver (Ag), titanium (Ti), alloys thereof, indium tin oxide (ITO), indium zinc oxide (IZO), indium gallium oxide (IGO), and indium gallium zinc oxide (IGZO).

An active layer 115 is disposed in the area where the extension line 110 and the reference voltage line 124 overlap, such that the active layer 115 further overlaps the extension line 110 and the reference voltage line 124. Specifically, the extension line 110 is disposed on a substrate 100, the active layer 115 is disposed on the extension line 110, and the reference voltage line 124 is disposed on the active layer 115. The active layer 115 may be disposed on the same layer and formed from the same material as the active layer (not shown) disposed in the display area. Here, the active layer 115 may be formed from, for example, amorphous silicon, polysilicon, or a metal oxide. This can simplify the process of forming the active layer 115.

The reference voltage line 124 is disposed to overlap a portion of the top surface of the active layer 115. That is, the reference voltage line 124 has a separated space in the area where the active layer 115 is disposed. Specifically, the reference voltage line 124 includes a first reference voltage line 124a connected to the second shorting bar 152 and overlapping a portion of the active layer 115 and a second reference voltage line 124b spaced apart from the first reference voltage line 124a and overlapping a portion of the active layer 115.

Since the extension line 110, the active layer 115, the first reference voltage line 124a, and the second reference voltage line 124b are disposed in an overlapping manner, a thin-film transistor (TFT) Tr can be provided. That is, the extension line 110 is disposed on the same line as the gate line (not shown), and the first reference voltage line 124a and the second reference voltage line 124b are spaced apart from each other, whereby the TFT Tr can be prevented from being shorted.

Here, when signal inspection on the TFT array is performed using the plurality of shorting bars 150, the TFT Tr may be in an ON-state in response to a driving signal applied from the first shorting bar 151 to the extension line 110.

When the signal inspection on the TFT array is completed, the substrate 100 is cut along the scribing line 500. The substrate 100 may be cut by a scribing process and/or a grinding process. This consequently removes the plurality of shorting bars 150 disposed in the pad area.

In the process of removing the plurality of shorting bars 150 along the scribing line 500, a short circuit or a leakage current may be formed between the lines, e.g. 120, 121, and 124, due to impurities 200 or moisture penetration. This will now be discussed with reference to FIG. 7.

Figure 7:
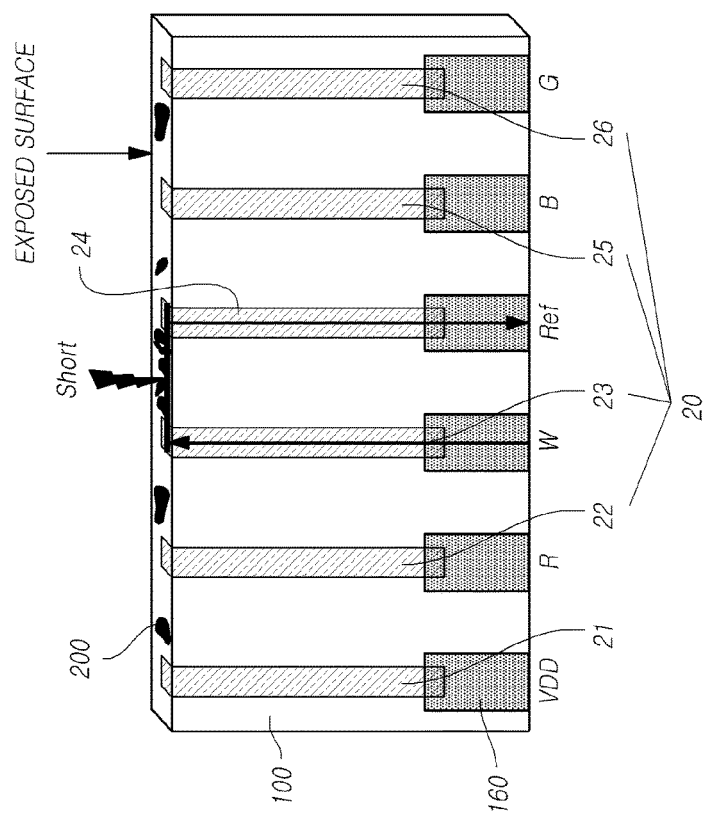
FIG. 7 is a perspective view illustrating a part of a pad area of an OLED display device according to a comparative example.

FIG. 7 is a perspective view illustrating a part of a pad area of an OLED display device according to a comparative example.

Referring to FIG. 7, a leakage current formed between a plurality of data lines 20 and a reference voltage line 24 may cause a sensing error. That is, when sensing TFT characteristics, a current lower than an actual threshold voltage Vth is sensed.

Due to such a sensing error, the threshold voltage of the TFT is misunderstood as having shifted in a positive direction, thereby causing a compensation error in a compensation value generated based on a sensing value. This consequently causes a compensation error in that a greater value than that to be actually compensated for is reflected as a compensation value. Due to such a compensation error caused by the leakage current, the pixels of the red (R), white (W), green (G), and blue (B) data lines 22, 23, 25, and 26, sharing the reference voltage line 24, may become brighter than predetermined levels of brightness, thereby degrading vertical image quality. In addition, the impurities 200 may cause a short circuit between at least two lines among the plurality of data lines 20, the power supply line 21, and the reference voltage line 24.

To address such a problem, an OLED display device according to the first embodiment includes a TFT in an area where at least one line of the plurality of lines formed in the pad area is disposed. This configuration will now be discussed with reference to FIG. 5.

Figure 5:
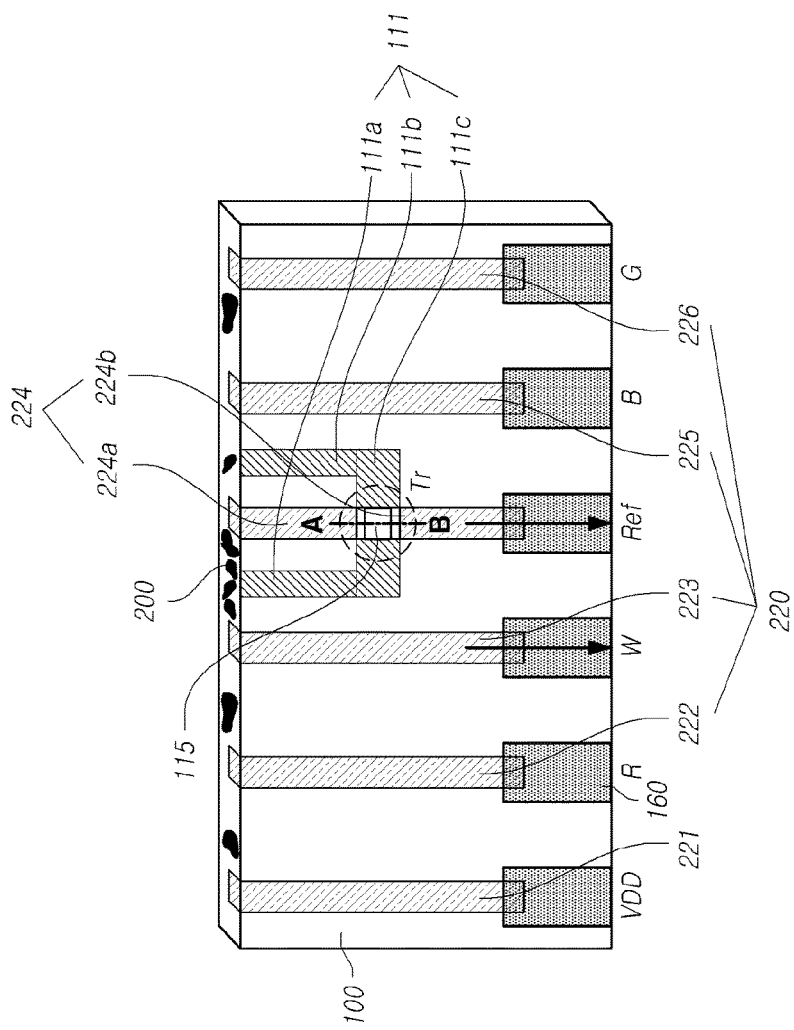
FIG. 5 is a perspective view illustrating a part of the pad area after the shorting bars are removed along the scribing line in FIG. 4.

FIG. 5 is a perspective view illustrating a part of the pad area after the shorting bars are removed along the scribing line in FIG. 4.

Referring to FIG. 5, since the substrate 100 is cut along the scribing line in order to remove the plurality of shorting bars after inspection, portions of a plurality of data lines 220, a power supply line 221, and a reference voltage line 224 may also be cut. That is, portions of the red (R), white (W), green (G), and blue (B) data lines 222, 223, 225, and 226 may also be cut.

In addition, a portion of an extension line 111 branched from one shorting bar of the plurality of shorting bars may be cut. Since the shorting bar, through which a signal is supplied to the extension line 111, is also removed, the TFT Tr disposed in the pad area may be switched to an OFF-state.

The extension line 111 disposed on the substrate 100 includes first and second extension lines 111a and 111b disposed parallel to the reference voltage line 224 and a third extension line 111c overlapping the reference voltage line 224. The first extension line 111a and the second extension line 111b may be spaced apart from each other, with the third extension line 111c being disposed therebetween. For example, the first extension line 111a is disposed between the white (W) data line 223 and the reference voltage line 224, and the second extension line 111b is disposed between the reference voltage line 224 and the blue (B) data line 225.

One end of the first extension line 111a is connected to one end of the third extension line 111c, and one end of the second extension line 111b is connected to the other end of the third extension line 111c. The first extension line 111a and the second extension line 111b separated from each other can be connected via the third extension line 111c.

On a boundary of the substrate 100 cut along the sub-scribing line, signal lines spaced apart from each other may be electrically connected via impurities 200 produced during the cutting process. In particular, when the reference voltage line 224 is electrically connected to another electrical line via the impurities 200, a sensing error may degrade image quality.

To address such a problem, the OLED display device according to the first embodiment includes a TFT Tr disposed in the pad area, in which the TFT Tr has the reference voltage line 224 as a component thereof. Specifically, when the impurities 200 are formed between the white (W) data line 223 and the reference voltage line 224, a signal applied from the white (W) data line 223 is transferred to the reference voltage line 224 via the impurities 200. Here, since the TFT Tr in the area where the reference voltage line 224 is disposed is in an OFF-state, the signal transferred from the white (W) data line 223 can be blocked. That is, since the extension line 111 is disconnected, the TFT Tr may be in an OFF-state, such that the signal transferred from the white (W) data line 223 may be blocked.

Accordingly, even in the case in which the impurities 200 are present between the white (W) data line 223 and the reference voltage line 224, the signal transferred from the white (W) data line 223 is blocked by the TFT Tr disposed in the area where the reference voltage line 224 is disposed, such that currents can flow independently through the white data line 223 and the reference voltage line 224. That is, the TFT Tr, disposed in the area where the reference voltage line 224 is disposed, can prevent a short circuit from being formed between different electrical lines.

Hereinafter, the reference voltage line 224 and the TFT Tr including the reference voltage line 224 as a component thereof will be discussed specifically with reference to FIG. 6.

Figure 6:
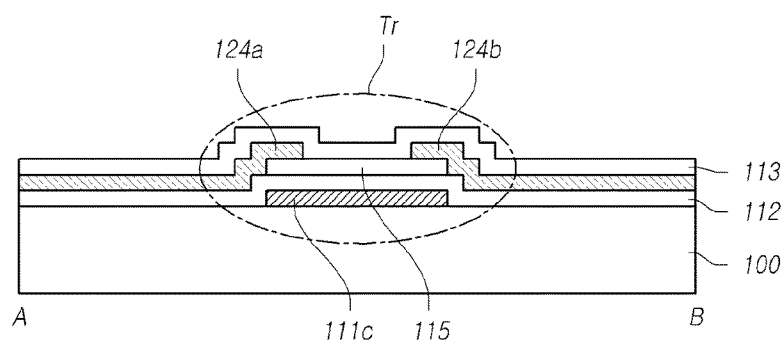
FIG. 6 is a cross-sectional view taken along line A-B in FIG. 5.

FIG. 6 is a cross-sectional view taken along line A-B in FIG. 5. Referring to FIG. 6, the third extension line 111c is disposed on the substrate 100. A first insulating film 112 is disposed on the third extension line 111c. The active layer 115 is disposed on the first insulating film 112 to overlap the third extension line 111c. The first reference voltage line 124a is disposed on one end of the active layer 115, and the second reference voltage line 124b is disposed on the other end of the active layer 115. A second insulating film 113 is disposed on the first reference voltage line 124a and the second reference voltage line 124b.

The third extension line 111c can act as a gate electrode. The first reference voltage line 124a can act as a source electrode, and the second reference voltage line 124b can act as a drain electrode. That is, the third extension line 111c, the active layer 115, the first reference voltage line 124a, and the second reference voltage line 124b form the TFT Tr.

In the OLED display device according to the first embodiment, the TFT Tr disposed in the pad area includes the reference voltage line. It is thereby possible to prevent a short circuit or a leakage current from being formed due to impurities between the reference voltage line and another signal line disposed adjacent to the reference voltage line. Although the configuration in which the TFT Tr disposed in the pad area includes the reference voltage line is illustrated in FIG. 4 to FIG. 6, the OLED display device according to the first embodiment is not limited thereto, and the TFT Tr disposed in the pad area may have any configuration as long as it includes one or more signal lines of the plurality of signal lines disposed in the pad area. Here, the signal lines may be spaced apart from each other in the pad area, in particular, in a location overlapping the active layer 115. The plurality of signal lines may include the data line, the gate line, the power supply line, and the like.

Figure 8:
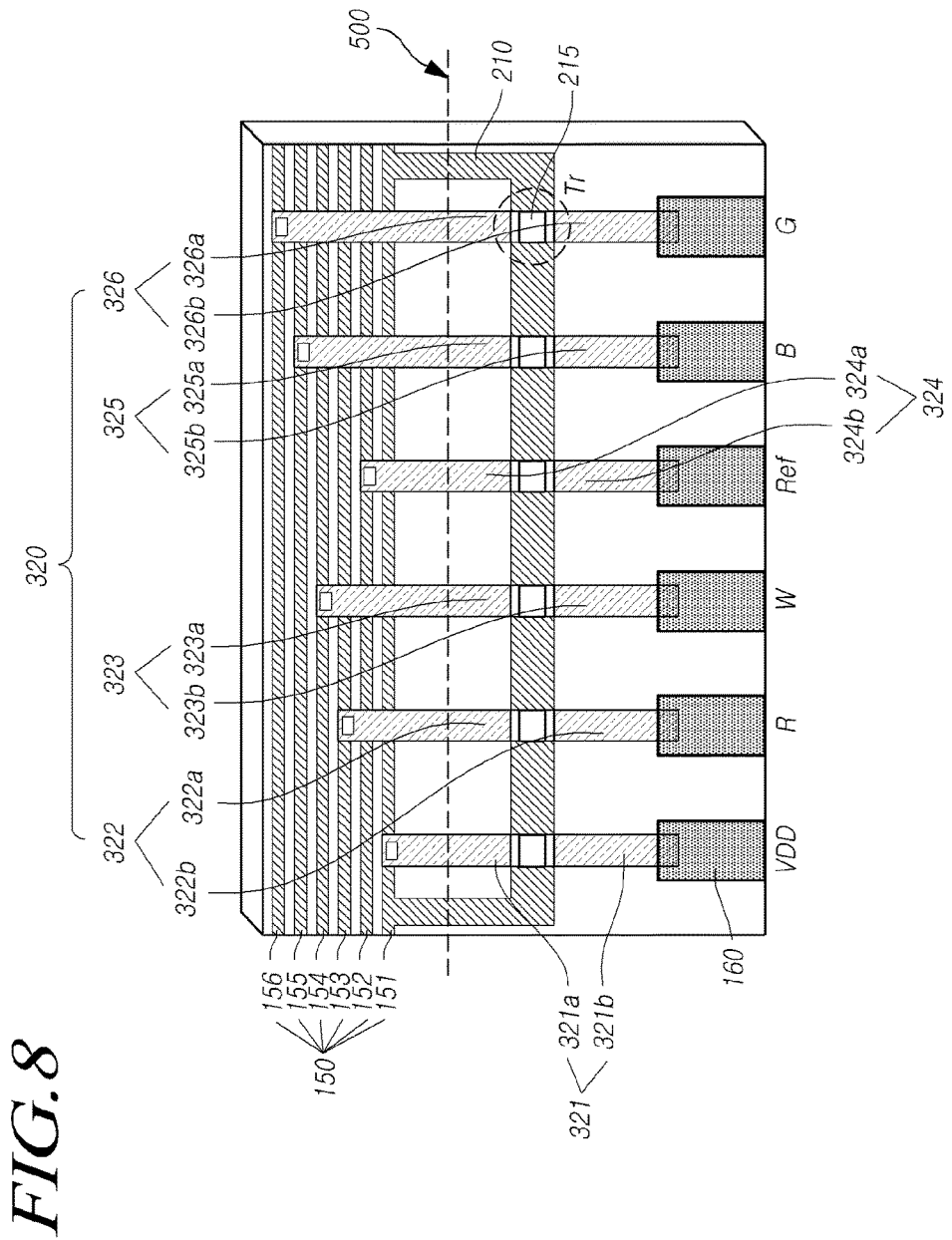
FIG. 8 is a perspective view illustrating a part of a structure in a pad area of a display panel according to an embodiment, in which a plurality of shorting bars and a plurality of lines are connected.
Figure 9:
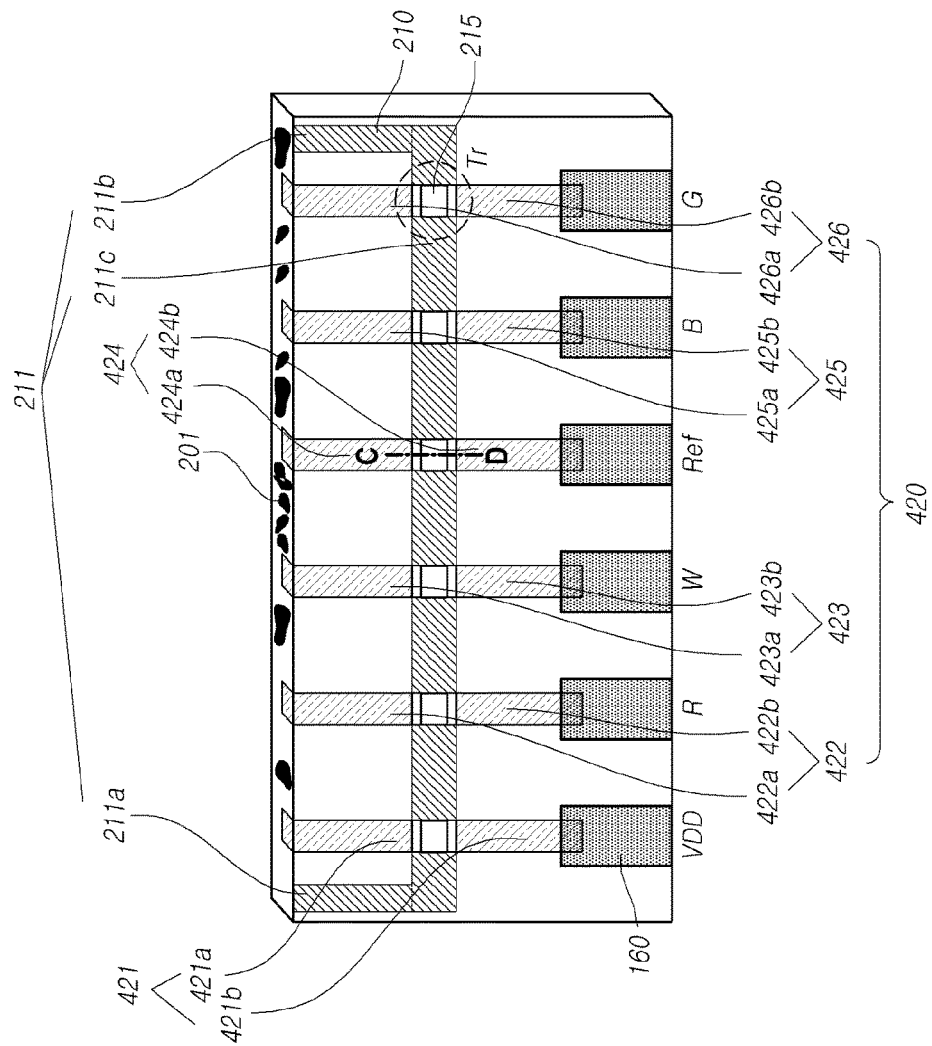
FIG. 9 is a perspective view illustrating a part of the pad area after the shorting bars are removed along the scribing line illustrated in FIG. 8.
Figure 10:
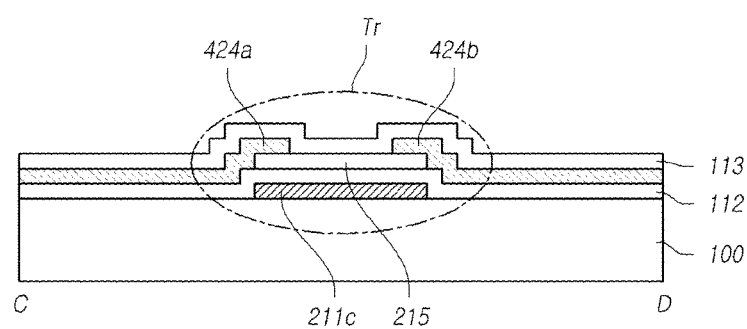
FIG. 10 is a cross-sectional view taken along line C-D in FIG. 9.

The OLED display device according to the present embodiments is not limited thereto, and may be configured as illustrated in FIG. 8 to FIG. 10.

FIG. 8 is a perspective view illustrating a part of a pad area of a display panel according to the second embodiment, in which a plurality of shorting bars and a plurality of lines are connected. The OLED display device according to the second embodiment may include the same components as those of the foregoing embodiment. Descriptions of the same or similar features will be omitted, since they may be similar or identical to those of the foregoing embodiment. In addition, the same reference numerals and signs will be used to designate the same or like components.

Referring to FIG. 8, the pad area of the display panel according to the second embodiment includes a plurality of shorting bars 150, as well as a plurality of data lines 320, a power supply line 321, and a reference voltage line 324 connected to the plurality of shorting bars 150.

The plurality of shorting bars 150 include a first shorting bar 151, a second shorting bar 152, a third shorting bar 153, a fourth shorting bar 154, a fifth shorting bar 155, and a sixth shorting bar 156. Here, the first shorting bar 151 is connected to a power supply line 321, and the second shorting bar 152 is connected to a reference voltage line 324. The third shorting bar 153 is connected to a red (R) data line 322, a fourth shorting bar 154 is connected to a white (W) data line, and a fifth shorting bar 155 is connected to a blue (B) data line 325, and a sixth shorting bar 156 is connected to a green data line 326.

An extension line 210 overlapping a plurality of signal lines is disposed in the pad area. Here, the extension line 210 is branched from one shorting bar among the plurality of shorting bars 150. For example, the extension line 210 is branched from the first shorting bar 151. Although the configuration of the extension line 110 branched from the first shorting bar 151 is illustrated in FIG. 8, the display device according to the second embodiment is not limited thereto.

The extension line 210 is branched from the first shorting bar 151, and is disposed to overlap the plurality of data lines 320, the power supply line 321, and the reference voltage line 324. The plurality of data lines 320 include the red (R) data line 322, the white (W) data line 323, the blue (B) data line 325, and the green (G) data line 326.

An active layer 215 is disposed in an overlapping manner in the area where the extension line 210 overlaps the plurality of data lines 320, the power supply line 321, and the reference voltage line 324. Specifically, the extension line 210 is disposed on the substrate 100, the active layer 215 is disposed on the extension line 210, and at least one component among the plurality of data lines 320, the power supply line 321, and the reference voltage line 324 is disposed on the active layer 215.

Here, the plurality of data lines 320, the power supply line 321, and the reference voltage line 324 are disposed to overlap a portion of the top surface of the active layer 215. That is, the plurality of data lines 320, the power supply line 321, and the reference voltage lien 324 have separated spaces in the area where the active layer 215 is disposed.

Specifically, the red (R) data line 322, the white (W) data line 323, the blue (B) data line 325, the green (G) data line 326, the power supply line 321, and the reference voltage line 324 respectively include a first red (R) data line 322a, a first white (W) data line 323a, a first blue (B) data line 325a, a first green (G) data line 326a, a first power supply line 321a, and a first reference voltage line 324a that are connected to one shorting bar among the plurality of shorting bars 150 and overlap a portion of the active layer 215.

In addition, the red (R) data line 322, the white (W) data line 323, the blue (B) data line 325, the green (G) data line 326, the power supply line 321, and the reference voltage line 324 respectively include a second red (R) data line 322b, a second white (W) data line 323b, a second blue (B) data line 325 second, a second green (G) data line 326b, a second power supply line 321b, and a second reference voltage line 324b that are respectively spaced apart from the first red (R) data line 322a, the first white (W) data line 323a, the first blue (B) data line 325a, the first green (G) data line 326a, the first power supply line 321a, and the first reference voltage line 324a and overlap a portion of the active layer 215.

More specifically, the red (R) data line 322 includes the first red (R) data line 322a and the second red (R) data line 322b. The white (W) data line 323 includes the first white (W) data line 323a and the white (W) data line 323b. The blue (B) data line 325 includes the first blue (B) data line 325a and the second blue (B) data line 325b. The green (G) data line 326 includes the first green (G) data line 326a and the second green (G) data line 326b. The power supply line 321 includes the first power supply line 321a and the second power supply line 321b. The reference voltage line 324 includes the first reference voltage line 324a and the second reference voltage line 324b.

As described above, the active layer 215 is disposed in an overlapping manner in the area where the extension line 210 overlaps the plurality of data lines 320, the power supply line 321, and the reference voltage line 324, thereby forming a plurality of TFT Tr. When a signal inspection on the TFT array is performed using the plurality of shorting bars 150, the TFT Tr may be in an ON-state in response to a driving signal applied from the first shorting bar 151 to the extension line 210.

In addition, when the signal inspection on the TFT array is completed, the substrate 100 is cut along the scribing line 500. This consequently removes the plurality of shorting bars 150 disposed in the pad area.

Hereinafter, the configuration in which the plurality of shorting bars 150 are removed will be discussed with reference to FIG. 9. FIG. 9 is a perspective view illustrating a part of the pad area after shorting bars are removed along a scribing line.

Referring to FIG. 9, when the substrate 100 is cut in order to remove the plurality of shorting bars, portions of the plurality of data lines 420, the power supply line 421, and the reference voltage line 424 may also be cut. That is, portions of the red (R), white (W), the green (G), and blue (B) data lines 422, 423, 425, and 426 may also be cut.

In addition, a portion of the extension line 211 branched from one shorting bar among the plurality of shorting bars may be cut. Since the shorting bar, through which a signal is supplied to the extension line 211, is also removed, the TFT Tr disposed in the pad area may be in an OFF-state.

The extension line 211 disposed on the substrate 100 includes first to third extension lines 211a to 211c. The first and second extension lines 211a and 211b are disposed parallel to the plurality of data lines 420, the power supply line 421, and the reference voltage line 424. The third extension line 211c overlaps the plurality of data lines 420, the power supply line 421, and the reference voltage line 424. Here, the first extension line 211a and the second extension line 211b may be spaced apart from each other, with the third extension line 211c being disposed therebetween. For example, the first extension line 211a is disposed on one side of the power supply line 321, and the second extension line 211b is disposed on one side of the green (G) data line 426.

One end of the first extension line 211a is connected to one end of the third extension line 211c, and one end of the second extension line 211b is connected to the other end of the third extension line 211c. The first extension line 211a and second extension line 211b spaced apart from each other can be connected via the third extension line 211c. Before the substrate 100 is cut to remove the shorting bars, a signal may be applied from the shorting bar to the first or second extension line 221a or 221b and then may be transferred to the third extension line 221c. When a signal is transferred to the third extension line 221c, the TFT Tr may be switched to an ON-state.

On a boundary of the cut substrate 100, signal lines spaced apart from each other may be electrically connected via impurities 201 produced during the cutting process, thereby causing a short circuit therebetween. In the OLED display device according to the second embodiment, this problem may be reduced or prevented by disposing the TFT Tr to overlap portions of the plurality of data lines 420, the power supply line 421, and the reference voltage line 424.

For example, when the impurities 201 are formed between the red (R) data line 422 and the white (W) data line 423, a signal applied from the red (R) data line 422 is transferred to the white (W) data lines 423 via the impurities 201. Here, since the TFT Tr disposed in the area where the white (W) data lines 423 is disposed in in an OFF-state, the signal transferred from the red (R) data line 422 can be blocked.

Accordingly, even in the case in which the impurities 201 are present between the red (R) data line 422 and the white (W) data line 423, the signal transferred from the red (R) data line 422 is blocked by the TFT Tr disposed in the area where the white (W) data line 423 is disposed, such that currents can flow independently through the red (R) data line 422 and the white (W) data line 423. That is, the TFT Tr, disposed in the area where the plurality of data lines 420, the power supply line 421, and the reference voltage line 424 are disposed, can prevent the impurities 201 from forming a short circuit between different electrical lines. According to the disclosed configuration, the TFT Tr disposed in the pad area is disposed in a portion of the area where the plurality of data lines 420, the power supply line 421, and the reference voltage line 424 are disposed. However, the OLED display device according to the second embodiment is not limited thereto, and the TFT Tr having the same configuration as described above can be disposed in the area where the plurality of gate lines (not shown) are disposed.

Hereinafter, the TFT Tr disposed in the area where the plurality of data lines 420, the power supply line 421, and the reference voltage line 424 are disposed will be discussed specifically with reference to FIG. 10.

FIG. 10 is a cross-sectional view taken along line C-D in FIG. 9. Referring to FIG. 10, the third extension line 211c can act as a gate electrode. The first reference voltage line 424a can act as a source electrode, and the second reference voltage line 424b can act as a drain electrode. That is, the third extension line 211c, the active layer 215, the first reference voltage line 424a, and the second reference voltage line 424b form the TFT Tr.

Although only the TFT Tr including the reference voltage line is illustrated in FIG. 10, the second embodiment is not limited thereto. The cross-section of the TFT including the plurality of data lines and the power supply line may have the same configuration as illustrated in FIG. 10.

As described above, in the OLED display device according to the second embodiment, the TFT Tr is disposed in the pad area, and includes the reference voltage line 224 as a component. Since the TFT Tr is in an OFF-state, a signal generated by a specific signal line can be reduced or prevented from being transferred to the other line via impurities.

The features, structures, and effects described in the present disclosure are included in at least one embodiment but are not necessarily limited to a particular embodiment. A person skilled in the art can apply the features, structures, and effects illustrated in the particular embodiment to another embodiment by combining or modifying such features, structures, and effects. It should be understood that all such combinations and modifications are included within the scope of the present disclosure.

Although the exemplary embodiments of the present disclosure have been described for illustrative purposes, a person skilled in the art will appreciate that various modifications and applications are possible without departing from the essential characteristics of the present disclosure. For example, the specific components of the exemplary embodiments may be variously modified.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing an organic light-emitting diode (OLED) display device, comprising:
    forming a display area of a display panel including an array of pixels on a substrate, each pixel including a first thin film transistor (TFT);
    forming a plurality of pads in a non-display area of the display panel outside the display area, each pad connected to a first signal line extended to the array of pixels in the display area;
    forming a plurality of shorting bars outside the plurality of pads, each pad connected to a second signal line that is electrically connected to one the plurality of shorting bars;
    forming an extension line crossing one or more of second signal lines of the plurality of pads, the extension line having two ends that are electrically connected to one or more of the plurality of shorting bars;
    inspecting an operation of the array of pixels by applying test signals to the plurality of shorting bars; and removing the shorting bars from the display panel.

2. The method according to claim 1, wherein each of the one or more of second signal lines of the plurality of pads includes an active layer of a second TFT.

3. The method according to claim 2, wherein the active layer of the second TFT is formed of the same material as that of the first TFT.

4. The method according to claim 3, wherein two portions of each of the one or more of second signal lines that are in contact with the active layer are source and drain electrodes of the second TFT.

5. The method according to claim 2, wherein a portion of the extension line that crosses each of the one or more of second signal lines is a gate electrode of the second TFT.

6. The method according to claim 5, further comprising forming an insulating layer on the extension line.

7. The method according to claim 1, wherein the shorting bars are removed from the display panel by cutting or grinding the substrate.

8. The method according to claim 7, wherein the first signal lines include a data line, a power supply line and a reference voltage line.

9. The method according to claim 8, wherein the one or more of second signal lines correspond to the data line, the power supply line and the reference voltage line.

10. The method according to claim 1, wherein the applying test signals to the plurality of shorting bars comprises turning on the second TFT included in each of the one or more of second signal lines.

* * * * *